United States Patent
Nawata

(10) Patent No.: US 8,576,623 B2
(45) Date of Patent: Nov. 5, 2013

(54) NON-VOLATILE SEMICONDUCTOR STORAGE DEVICE

(75) Inventor: Hidefumi Nawata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 263 days.

(21) Appl. No.: 13/223,891

(22) Filed: Sep. 1, 2011

(65) Prior Publication Data

US 2012/0236637 A1   Sep. 20, 2012

(30) Foreign Application Priority Data

Mar. 14, 2011   (JP) .................................. 2011-055291

(51) Int. Cl.
*G11C 16/04* (2006.01)
*G11C 16/34* (2006.01)

(52) U.S. Cl.
USPC .............. 365/185.03; 365/185.09; 365/185.2; 365/185.22

(58) Field of Classification Search
USPC ............... 365/185.2, 185.16, 185.17, 185.18, 365/185.24, 185.19, 185.05, 185.03, 365/185.09, 185.22, 185.28
See application file for complete search history.

(56) References Cited

U.S. PATENT DOCUMENTS

| | | | |
|---|---|---|---|
| 7,489,549 B2 | 2/2009 | Mokhlesi | |
| 2008/0158951 A1* | 7/2008 | Aritome | 365/185.03 |
| 2012/0195120 A1* | 8/2012 | Iwai | 365/185.03 |
| 2012/0201077 A1* | 8/2012 | Nagao | 365/185.03 |

FOREIGN PATENT DOCUMENTS

JP   2009-541909   11/2009

* cited by examiner

*Primary Examiner* — Harry W Byrne
*Assistant Examiner* — Hien Nguyen
(74) *Attorney, Agent, or Firm* — Oblon, Spivak, McClelland, Maier & Neustadt, L.L.P.

(57) ABSTRACT

A non-volatile semiconductor storage device according to one embodiment includes a memory cell array that has NAND cell units in which a plurality of memory cells are connected in series, the control gate of each of the plurality of memory cells being connected to a word line, and a control circuit configured to execute a write operation by applying a write voltage to the word line. The control circuit is configured to execute a correction write operation accompanied by the write operation and executed on a selected memory cell, when a threshold voltage of data written in a reference memory cell is an erase level, the reference memory cell being the memory cell adjacent to the selected memory cell and in which the data is written after the write operation on the selected memory cell.

20 Claims, 15 Drawing Sheets

FIG. 2
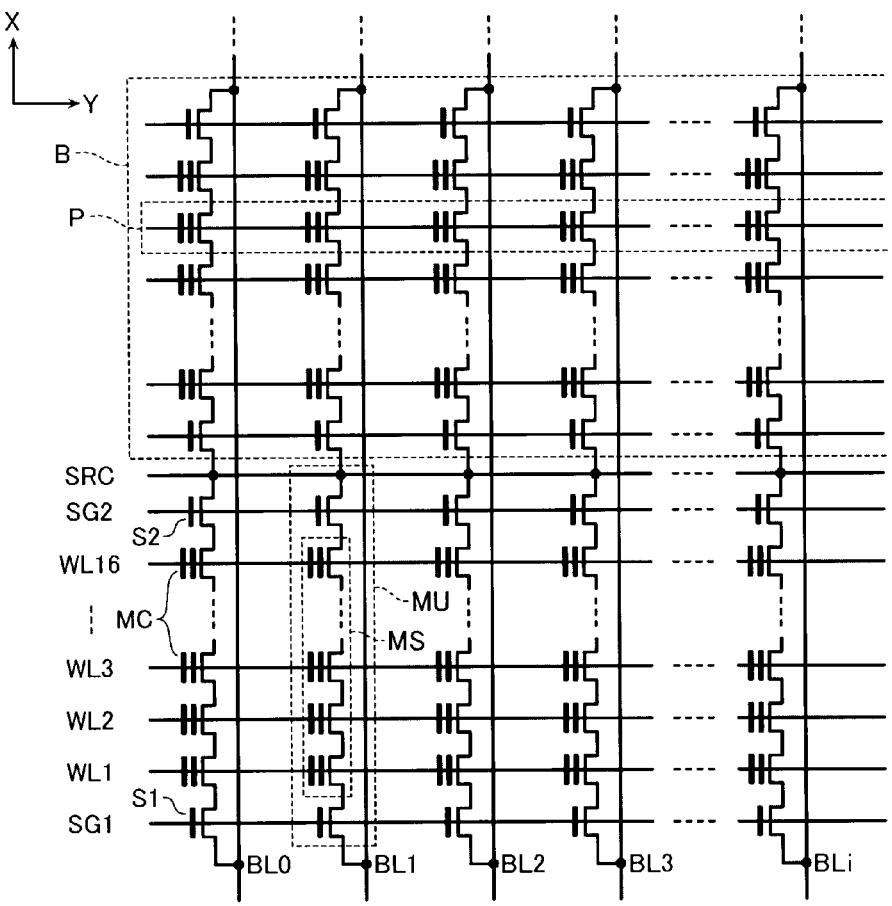
FIG. 3    COMPARATIVE EXAMPLE
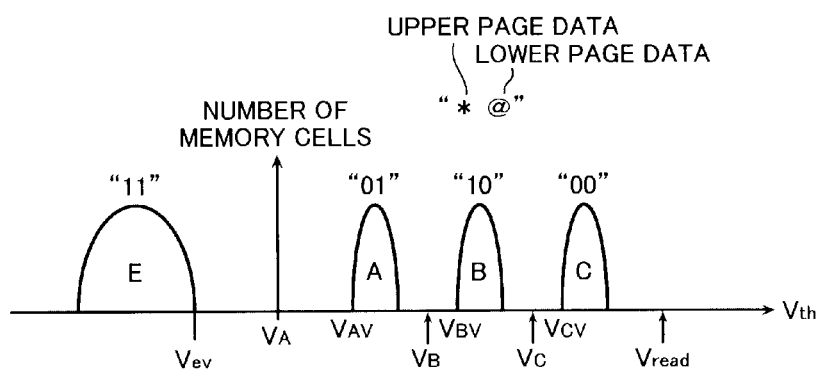

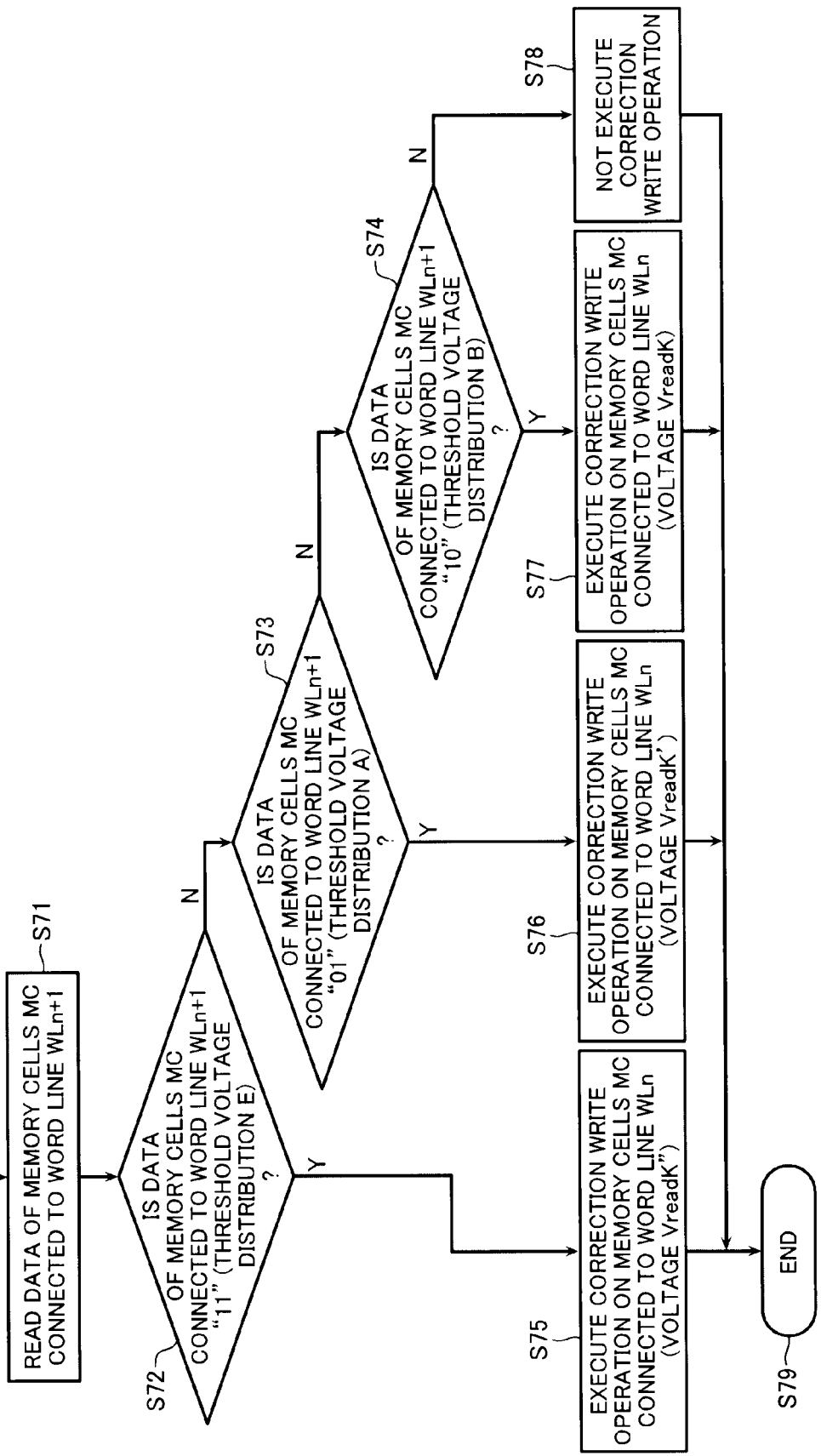

NON-VOLATILE SEMICONDUCTOR STORAGE DEVICE

CROSS REFERENCE TO RELATED APPLICATION

This application is based upon and claims the benefit of priority from prior Japanese Patent Application No. 2011-55291, filed on Mar. 14, 2011, the entire contents of which are incorporated herein by reference.

BACKGROUND

1. Field

Embodiments described herein generally relate to an electrically rewritable non-volatile semiconductor storage device.

2. Description of the Related Art

With an increase in use of a large capacity of data such as images or videos in mobile devices, the demand for NAND type flash memories is rapidly increasing. In particular, by adopting a multi-valued storage technology for storing information of 2 bits or more in a memory cell, a larger capacity of information can be stored with a small chip area.

In highly-integrated flash memories with the advancement of miniaturization of cells, at the time of a write operation on memory cells adjacent to memory cells where a data write operation ends, threshold voltage distributions that indicate data of the memory cells where the write operation is completed are affected by interference of the adjacent cells. In particular, when a multi-valued storage system is adopted, the width and the distance of the threshold voltage distributions are narrowly set as compared with a two-valued storage system. As a result, the interference of the adjacent cells greatly affects reliability of data.

BRIEF DESCRIPTION OF THE DRAWINGS

FIG. 2 is a circuit diagram illustrating the configuration of a memory cell array 1 illustrated in FIG. 1;

FIG. 3 is a diagram illustrating an example of written data in a four-valued storage flash memory;

FIG. 18A is a flowchart illustrating a data write sequence according to a sixth embodiment.

DETAILED DESCRIPTION

A non-volatile semiconductor storage device according to one embodiment includes a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines, and a control circuit configured to execute a write operation by applying a write voltage to the word line to set a threshold voltage of a selected memory cell corresponding to data. The control circuit is configured to execute a correction write operation accompanied by the write operation and executed on the selected memory cell, when a threshold voltage of data written in a reference memory cell is an erase level, the reference memory cell being the memory cell adjacent to the selected memory cell and in which the data is written after the write operation on the selected memory cell.

Next, non-volatile semiconductor storage devices according to embodiments will be described with reference to the drawings.

First Embodiment

Configuration

Figure 1:
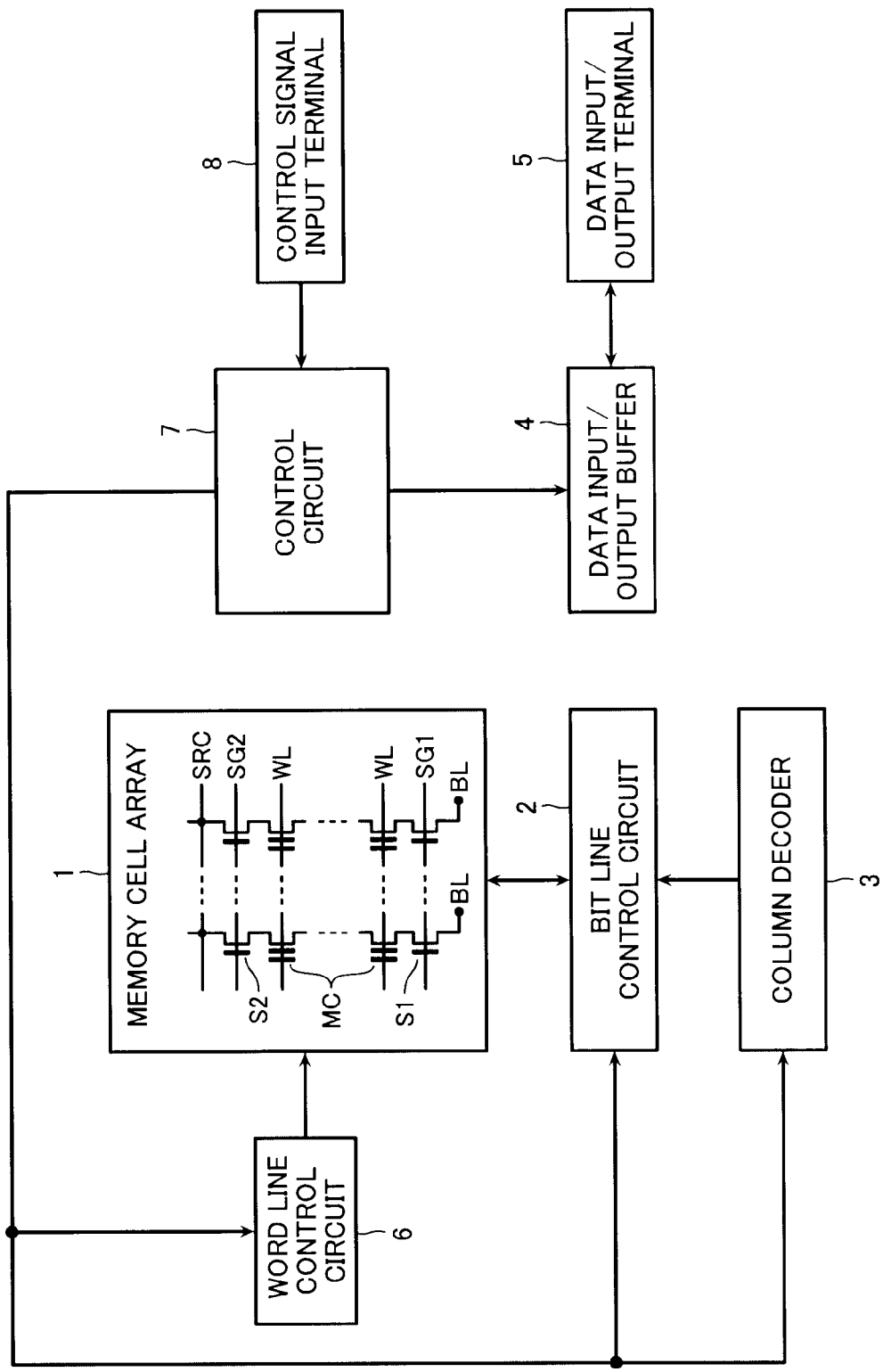
FIG. 1 is a block diagram illustrating the schematic configuration of a non-volatile semiconductor storage device according to a first embodiment.

FIG. 1 illustrates the configuration of a non-volatile semiconductor storage device according to a first embodiment. The non-volatile semiconductor storage device is a NAND type flash memory that adopts a four-valued storage system.

The non-volatile semiconductor storage device includes a memory cell array 1 in which memory cells MC to store data are disposed in matrix. The memory cell array 1 includes plural bit lines BL, plural word lines WL, a source line SRC, and plural memory cells MC. The memory cells MC are configured such that data is electrically rewritable and are disposed in a matrix at intersections of the bit lines BL and the word lines WL.

To the memory cell array 1, a bit line control circuit 2 that controls a voltage of the bit line BL and a word line control circuit 6 that controls a voltage of the word line WL are connected. The bit line control circuit 2 reads data of the memory cells MC in the memory cell array 1 through the bit lines BL. The bit line control circuit 2 applies a control voltage to the memory cells MC in the memory cell array 1 through the bit lines BL and executes a write operation on the memory cells MC.

To the bit line control circuit 2, a column decoder 3, a data input/output buffer 4, and a data input/output terminal 5 are connected. The data of the memory cells MC that are read from the memory cell array 1 are output from the data input/output terminal 5 to the outside. Further, write data input from the outside to the data input/output terminal 5 is input to the bit line control circuit 2 by the column decoder 3 and is written in the designated memory cell MC.

The memory cell array 1, the bit line control circuit 2, the column decoder 3, the data input/output buffer 4, and the word line control circuit 6 are connected to a control circuit 7. The control circuit generates a control signal to control the bit line control circuit 2, the column decoder 3, the data input/output buffer 4, and the word line control circuit 6, according to a control signal input to a control signal input terminal 8.

FIG. 2 illustrates the configuration of the memory cell array 1 illustrated in FIG. 1. As illustrated in FIG. 2, the memory cell array 1 is configured by plural blocks B. In the memory cell array 1, data is erased the block B basis (block erasing processing).

As illustrated in FIG. 2, the block B is configured to include plural memory units MU. One memory unit MU is configured to include a memory string MS including, for example, 16 memory cells MC (EEPROM) connected in series and first and second selection transistors S1 and S2 connected to both ends of the memory string MS, respectively. One end of the first selection transistor S1 is connected to the bit line BL0 and one end of the second selection transistor S2 is connected to the source line SRC. Control gates of the memory cells MC that are disposed in line in a Y direction are commonly connected to any one of the word lines WL1 to WL16. Further, control gates of the first selection transistors S1 that are disposed in line in the Y direction are commonly connected to a selection line SG1 and control gates of the second selection transistors S2 that are disposed in line in the Y direction are commonly connected to a selection line SG2. A set P of plural memory cells MC that are connected to one word line WL constitutes one page or multiple pages. For each set P, data is written and read.

Write System

Next, the write system of the non-volatile semiconductor storage device will be schematically described. The non-volatile semiconductor storage device is configured such that threshold voltages of the memory cells MC have four distributions.

Before describing the first embodiment, first, a write system of a non-volatile semiconductor storage device according to a comparative example will be described. FIG. 3 illustrates a relation between four-valued data (data "11", "01", "10", and "00") of two bits stored in the memory cells MC of the non-volatile semiconductor storage device according to the comparative example and threshold voltage distributions of the memory cells MC. In FIG. 3, voltages VA, VB, and VC are voltages that are applied to the selected word lines WL when four kinds of data are read. Voltages VAV, VBV, and VCV represent verification voltages that are applied to verify whether the write operation is completed, when the write operation is executed with threshold voltage distributions A, B, or C. A voltage Vread represents a read voltage that is applied to a non-selected memory cell MC of the memory string MS when data is read and makes a current flow through the non-selected memory cell MC, regardless of data held in the non-selected memory cell MC. A voltage Vev is an erase verification voltage that is applied to the memory cell MC to verify whether an erase operation is completed, when data of the memory cell MC is erased. A magnitude relation between the voltages described above is Vev<VA<VAV<VB<VBV<VC<VCV<Vread.

In a threshold voltage distribution E of the memory cells MC after a block is erased, an upper limit value is a negative value and data "11" is allocated. The memory cells MC that show data "01", "10", and "00" in a write state constitute the positive threshold voltage distributions A, B, and C, respectively (that is, lower limit values of the distributions A, B, and C are positive values). The threshold voltage distribution A of the data "01" has the lowest voltage, the threshold voltage distribution C of the data "00" has the highest voltage, and the threshold voltage distribution B of the data "10" has an intermediate voltage of the data "01" and the data "00".

As illustrated in FIG. 3, 2-bit data of one memory cell MC includes lower page data and upper page data. When the 2-bit data is represented as data "*@", "*" indicates the upper page data and "@" indicates the lower page data. In the comparative example, the lower page data and the upper page data are written in the memory cells MC by executing different data write processing, that is, two data write processing on the lower page data and the upper page data.

Figure 4:
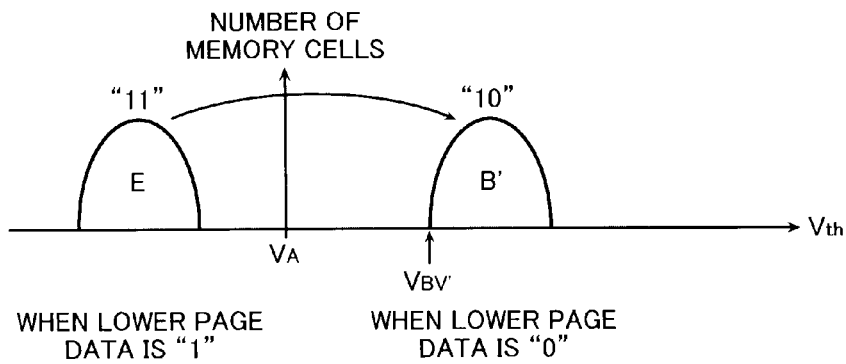
FIG. 4 is a conceptual diagram illustrating a data write sequence in the four-valued storage flash memory.

Next, a write operation of the lower page data will be described with reference to FIG. 4. In FIG. 4, all of the memory cells MC show the threshold voltage distribution E of an erase state and store data "11". As illustrated in FIG. 4, if the write operation of the lower page data is executed, the threshold voltage distribution E of the memory cells MC is divided into two threshold voltage distributions E and B' corresponding to a value ("1" or "0") of the lower page data. That is, when the value of the lower page data is "1", the threshold voltage distribution E of the erase state is maintained.

Meanwhile, when the value of the lower page data is "0", a high electric field is applied to a tunnel oxide film of the memory cell MC, electrons are injected into a floating gate electrode, and a threshold voltage Vth of the memory cell MC is increased by a certain amount. Specifically, a verification voltage VBV' is set and the electron injection operation and the verification operation are repeated. The electron injection is repeated until the threshold voltage of the memory cell MC becomes the verification voltage VBV' or more. As a result, a state of the memory cell MC changes to a write state (data "10").

Next, a write operation of the upper page data will be described with reference to FIG. 5. The write operation of the upper page data is executed on the basis of write data (upper page data) input from the outside of a chip and the lower page data already written in the memory cell MC.

Figure 5:
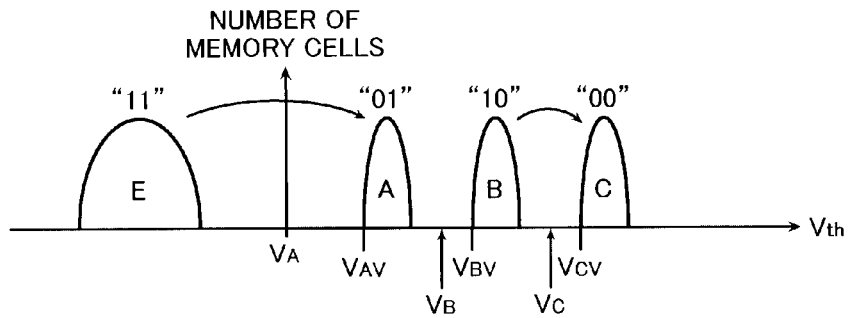
FIG. 5 is a conceptual diagram illustrating a data write sequence in the four-valued storage flash memory.

That is, as illustrated in FIG. 5, when the value of the upper page data is "1", the high electric field is not applied to the tunnel oxide film of the memory cell MC, such that the threshold voltage Vth of the memory cell MC is prevented from increasing. As a result, the memory cell MC that has data "11" (threshold voltage distribution E of the erase state) maintains the data "11" and the memory cell MC that has data "10" (threshold voltage distribution B') maintains the data "10". However, a lower limit value of the threshold voltage distribution B' can be adjusted by referring to the regular verification voltage VBV higher than the verification voltage VBV'. Thereby, the width of the threshold voltage distribution B' may be narrowed and the threshold voltage distribution B may be formed.

Meanwhile, when the value of the upper page data is "0", the high electric field is applied to the tunnel oxide film of the memory cell MC, the electrons are injected into the floating gate electrode, and the threshold voltage Vth of the memory cell MC is increased by a certain amount. Specifically, the verification voltages VAV and VCV are set and the electron injection operation and the verification operation are repeated. The electron injection is repeated until the threshold voltage of the memory cell MC becomes the verification voltages VAV and VCV or higher. As a result, the data of the memory cell MC that has data "11" (threshold voltage distribution E of the erase state) changes to the data "01" of the threshold voltage distribution A and the data of the memory cell MC that has data "10" changes to the data "00" of the threshold voltage distribution C.

This is an example of the data write system in the nonvolatile semiconductor storage device according to the comparative example. The threshold voltage distribution E showing the erase state or any one of the three threshold voltage distributions A, B, and C are applied to the memory cell MC and data of two bits is stored in each memory cell. In a multi-valued storage system of 3 bits or more, in addition to the above operation, an operation for further dividing the threshold voltage distribution is only added, and the basic operation of the multi-valued storage system is the same as the above storage system.

Next, the write operation that is executed by the set P illustrated in FIG. 2 basis will be described as an example of the write operation on the memory cells MC. That is, data is collectively written in all of the memory cells MC connected to one word line WL. However, even when data is alternately written in the memory cells MC connected to an odd-numbered bit line and the memory cells MC connected to an even-numbered bit line among the unit of the set P, the following description may be applied. Next, a write system of the set P basis will be described with reference to FIGS. 6A and 6B. In this case, an example of an upper page write operation will be described.

Figure 6A:
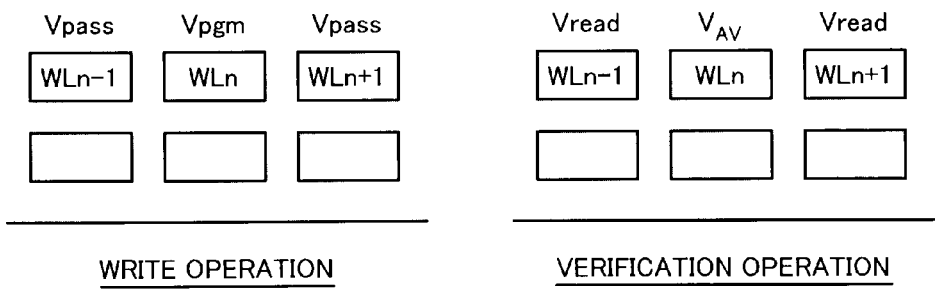
FIG. 6A is a diagram illustrating voltages at the time of a write operation and a verification operation according to a comparative example.

FIG. 6A is a diagram schematically illustrating the cross-section of the memory cell array 1 taken along the bit line BL. FIG. 6A illustrates a voltage application state when the write operation is executed on the memory cells MC connected to the selected word line WLn. The upper page write operation for each word line WL is executed by alternately repeating the write operation and the verification operation. The write operation is an operation for applying a write voltage Vpgm to the selected word line WLn and injecting electrons into the floating gate electrode. During the verification operation, a verification voltage (for example, voltage VAV in FIG. 6A) is applied to the selected word line WLn and a voltage Vread is applied to the non-selected word lines WLn−1 and WLn+1.

At this time, it is determined whether data is written in the selected memory cell MC, on the basis of whether a current flows through a channel.

Figure 6B:
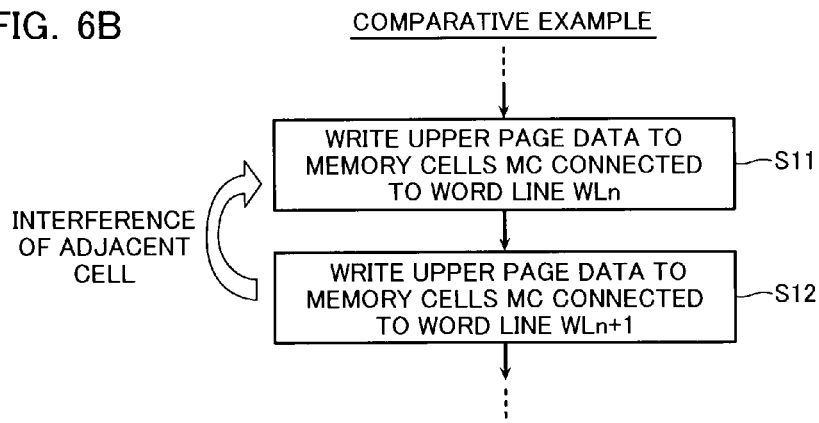
FIG. 6B is a flowchart illustrating a data write sequence according to the comparative example.

As described above, the write operation on the memory cells MC is executed by the set P basis. As illustrated in FIG. 6B, the upper page data is collectively written in the memory cells MC connected to the word line WLn (step S11). Next, the upper page data is collectively written in the memory cells MC connected to the word line WLn+1 (step S12). As such, during the upper page write operation that is executed by the set P basis, the threshold voltages of the memory cells MC are changed by the write operation on the memory cells MC of the adjacent set P. That is, by the write operation for applying the voltage to the memory cells MC connected to the word line WLn+1, the threshold voltages of the write operation-completed memory cells MC that are connected to the word line WLn are changed. This phenomenon is hereinafter called "interference of the adjacent cells". This phenomenon becomes remarkable when the distance between the memory cells MC decreases.

Figure 7A:
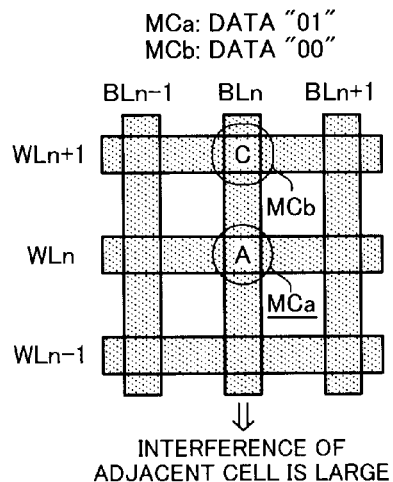
FIG. 7A is a diagram illustrating an influence by interference of adjacent cells according to the comparative example.

The threshold voltage distribution illustrated in FIG. 5 may be changed even after the write operation on the selected memory cell MC ends by writing data in the adjacent cells. For example, as illustrated in FIG. 7A, the case where data "00" (threshold voltage distribution C) is written in an adjacent memory cell MCb after data "01" (threshold voltage distribution A) is written in a memory cell MCa is considered. In this case, the memory cell MCa is written with the threshold voltage distribution A and the memory cell MCb is written with the threshold voltage distribution C. As a result, the memory cell MCa suffers interference from the adjacent cell at the time of the write operation on the adjacent memory cell MCb. Therefore, the threshold voltage of the memory cell MCa is greatly shifted in a positive direction.

Figure 7B:
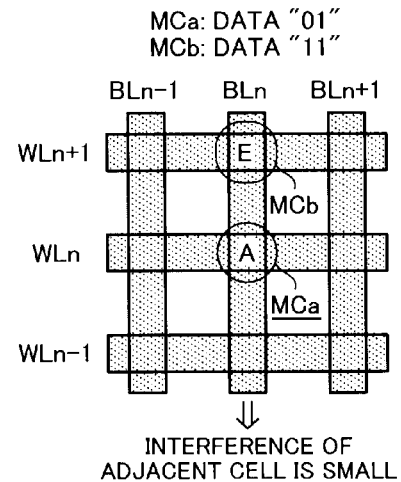
FIG. 7B is a diagram illustrating an influence by interference of adjacent cells according to the comparative example.

Meanwhile, for example, as illustrated in FIG. 7B, the case where data "11" (threshold voltage distribution E) is written in the adjacent memory cell MCb after the data "01" (threshold voltage distribution A) is written in the memory cell MCa is considered. In this case, the memory cell MCa is written with the threshold voltage distribution A and the memory cell MCb is maintained in the threshold voltage distribution E. As a result, since the high voltage is not applied to the memory cell MCb, the memory cell MCa rarely suffers the interference from the adjacent cell. Therefore, different from the example illustrated in FIG. 7A, the threshold voltage of the memory cell MCa is rarely shifted.

As such, the threshold voltage of the memory cell MCa greatly changes when the data "01", "10", and "00" (write state) are written in the adjacent memory cell MCb. Meanwhile, the threshold voltage of the memory cell MCa rarely changes when the adjacent memory cell MCb holds the data "11" (erase state). In this case, a large number of memory cells MC exist in the memory cell array 1. That is, in the memory cell array 1, data holding patterns illustrated in FIGS. 7A and 7B are mixed. As a result, the memory cells MC where the shift amount of the threshold voltage is large and the memory cells MC where the shift amount is small are mixed.

Figure 7C:
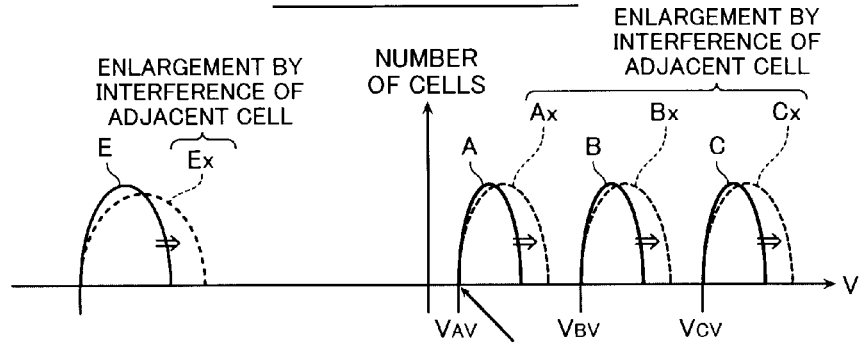
FIG. 7C is a diagram illustrating an influence by interference of adjacent cells according to the comparative example.

Accordingly, as illustrated in FIG. 7C, the threshold voltage distribution A of the memory cell MCa becomes a threshold voltage distribution Ax that has the larger distribution width due to the interference of the adjacent memory cell MCb. In this case, a lower limit value of the threshold voltage distribution Ax is almost equal to a lower limit value of the original threshold voltage distribution A (refer to the arrow of FIG. 7C). For the same reason, the threshold voltage distributions B and C become threshold voltage distributions Bx and Cx that have the larger distribution widths, respectively. Lower limit values of the threshold voltage distributions Bx and Cx are almost equal to lower limit values of the original threshold voltage distributions B and C. The threshold voltage distribution E also becomes a threshold voltage distribution Ex that has the larger distribution width. In this way, the threshold voltage distributions Ax, Bx, Cx, and Ex where the distribution widths are increased cause erroneous read or the like.

Write System According to the First Embodiment

Figure 8:
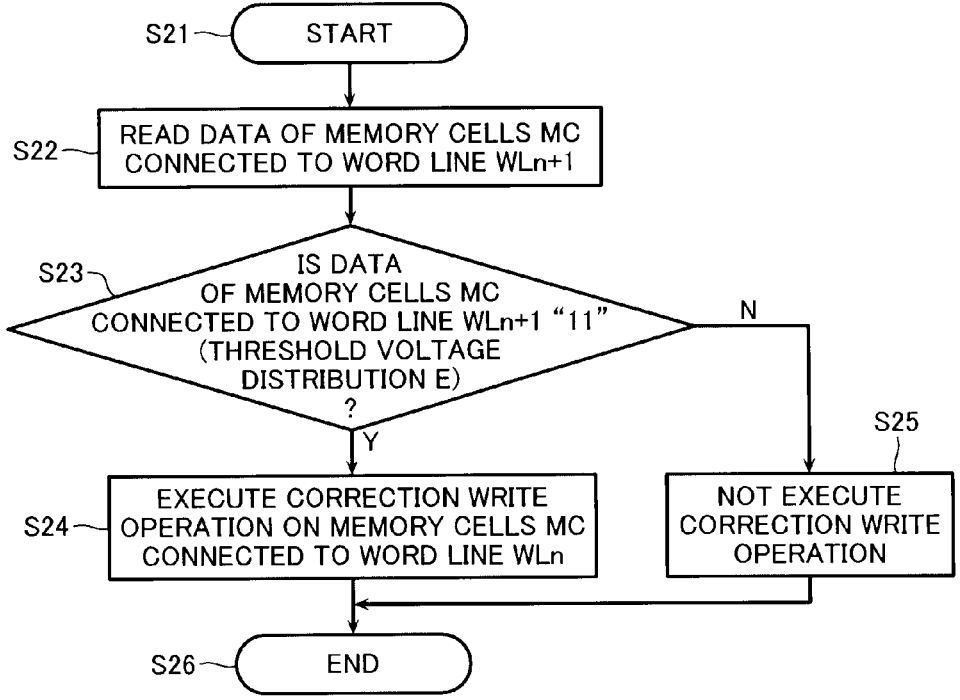
FIG. 8 is a flowchart illustrating a data write sequence according to the first embodiment.
Figure 9A:
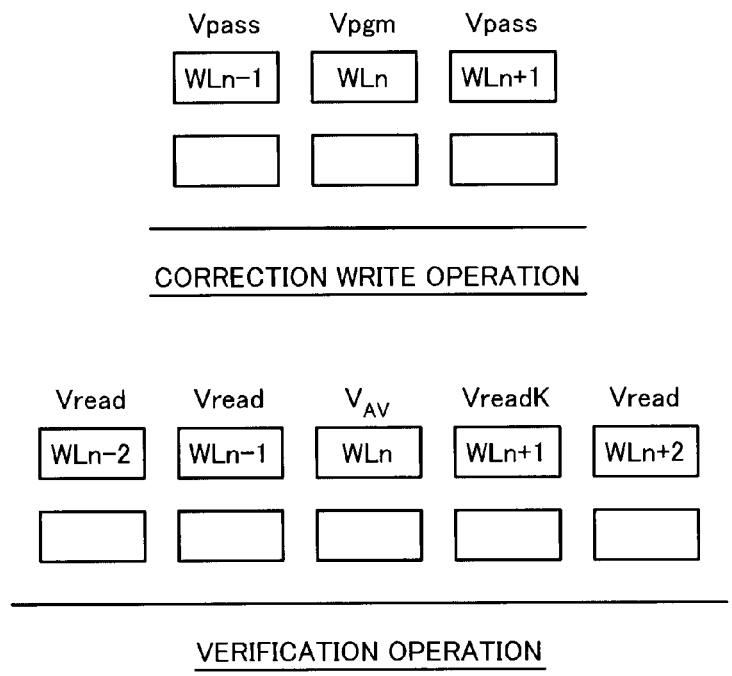
FIG. 9A is a diagram illustrating voltages at the time of a write operation and a verification operation according to the first embodiment.
Figure 9B:
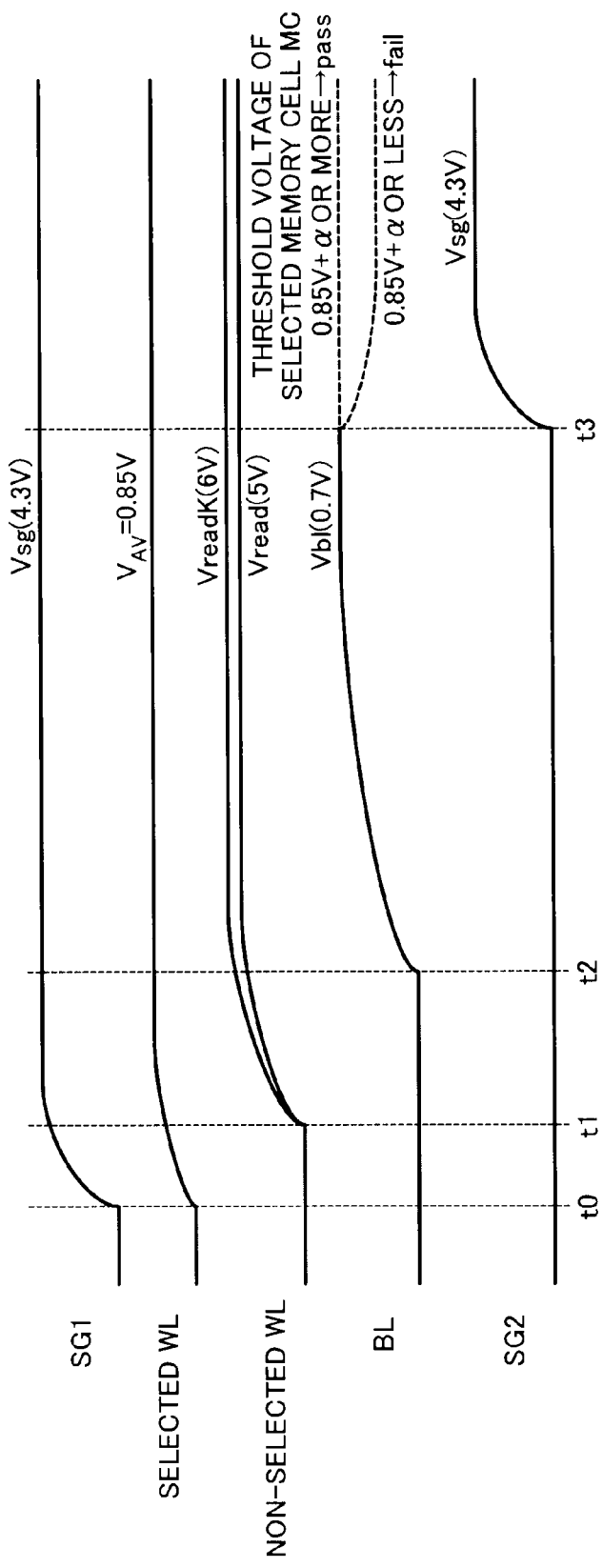
FIG. 9B is a timing chart illustrating a voltage at the time of a verification operation according to the first embodiment.

In the first embodiment, a write system illustrated in FIGS. 8, 9A and 9B is adopted in view of the problem of the write system according to the comparative example. Following processing is executed by the control circuit 7.

In the first embodiment, after writing the upper page data, a correction write operation for adjusting the width of the threshold voltage distribution is executed. In this embodiment, with execution of the correction write operation, a voltage of a write verification operation for verifying whether data is accurately written is adjusted. The voltage at the time of the write verification operation that is executed with the correction write operation is set on the basis of data written in the memory cell MC adjacent to the selected memory cell MC to which the correction write operation is executed. Execution order of the write operation is order of the sets P of the memory cells MC that are connected to the word lines WL0, WL1, WL2, . . . , WLn, and WLn+1.

The write operation, the correction write operation, and the write verification operation will be described with reference to FIG. 8. FIG. 8 is a flowchart illustrating an operation newly added after the write operation on the memory cells MC connected to the word lines WLn and WLn+1 ends. The data write operation is executed on the memory cells MC connected to the word line WLn and then the data write operation is executed on the memory cells MC connected to the word line WLn+1. When the data write operation on the memory cells MC connected to the word line WLn+1 ends, the correction write operation on the memory cells MC connected to the word line WLn starts (step S21).

During the correction write operation, first, data written in the memory cells MC connected to the word line WLn+1 is read (step S22). Next, it is determined whether the data written in the memory cells MC connected to the word line WLn+1 is "11" (threshold voltage distribution E) or the other data ("01", "10", and "00" (threshold voltage distributions A, B, and C)) (step S23). As described above, when the data written in the memory cells MC connected to the word line WLn+1 is "11" (threshold voltage distribution E), an influence of the interference of the adjacent cell applied to the memory cells MC connected to the word line WLn due to the data write operation on the memory cells MC is small. Meanwhile, when the data written in the memory cells MC connected to the word line WLn+1 is "00" (threshold voltage distribution C), the influence of the interference of the adjacent cell applied to the memory cells MC connected to the word line WLn due to the data write operation on the memory cells MC is large (refer to FIG. 7).

During the determination operation of step S23, when it is determined that the data written in the memory cells MC connected to the word line WLn+1 is "11", the correction write operation is executed on the memory cells MC connected to the word line WLn (step S24). Meanwhile, when it is determined that the data written in the memory cells MC connected to the word line WLn+1 is not "11", the correction write operation is not executed (step S25). Then, the correction write operation on the memory cells MC connected to the word line WLn ends (step S26).

FIG. 9A illustrates a voltage application state when the correction write operation is executed on the memory cells MC connected to the selected word line WLn. The correction write operation is also executed by alternately repeating the write operation and the verification operation. The write operation is an operation for applying a write voltage Vpgm to the selected word line WLn and injecting electrons into the floating gate electrode and is an operation that is the same as the normal upper page write operation. During the verification operation, a verification voltage (for example, voltage VAV in FIG. 9A) is applied to the selected word line WLn and a voltage Vread is applied to the non-selected word line. In this case, the verification operation at the time of the correction write operation is realized by increasing the verification voltage VAV to be higher than the voltage at the time of the normal data write operation. However, the verification operation according to this embodiment is different from the verification operation at the time of the normal write operation in that the verification voltage VAV does not change and a voltage VreadK (VreadK>Vread) is applied to the non-selected word line WLn+1 adjacent to the selected word line WLn.

FIG. 9B is a timing chart illustrating the voltage at the time of the verification operation. At time t0, a voltage Vsg is applied to the selection line SG1 to make the selection transistor S1 conductive. At the same time, the verification voltage VAV is applied to the selected word line WL. At time t1, the voltage Vread or VreadK is applied to the non-selected word line WL. At time t2, a voltage Vbl is applied to the bit line BL. At time t3, the voltage Vsg is applied to the selection line SG2 to make the selection transistor S2 conductive. At this time, it is determined whether the current flows through a channel and the bit line BL is discharged on the basis of the threshold voltage of the memory cells MC connected to the selected word line WL. In this case, the verification voltage VAV is applied to the selected word line WL. However, the threshold voltage of the selected memory cell MC is slightly decreased by the voltage VreadK applied to the adjacent word line WL. For this reason, at the time of the correction write operation, the situation becomes the same situation as that of the case in which the verification operation of applying the verification voltage VAV+α to the selected word line WL is executed.

Effect

Figure 10:
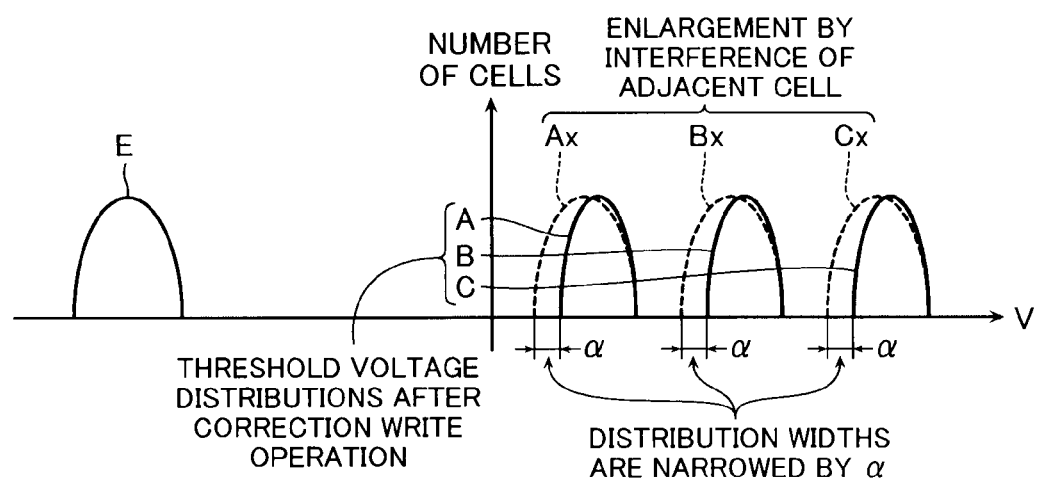
FIG. 10 is a diagram illustrating effects of a data write operation and a verification operation according to the first embodiment.

An effect of the correction write operation will be described with reference to FIGS. 7C and 10. As described above, FIG. 7C illustrates threshold voltage distributions after the write operation according to the comparative example. FIG. 10 illustrates threshold voltage distributions after the correction write operation according to the first embodiment. As described above, upper skirts of the threshold voltage distributions A, B, and C of the memory cells MC after the upper page write operation are enlarged by the data write operation on the adjacent memory cell MC. The threshold voltage distributions A, B, and C become the threshold voltage distributions Ax, Bx, and Cx that have the larger distribution widths (refer to FIG. 7C). Meanwhile, in this embodiment, the correction write operation is executed on the memory cells MC rarely affected by the interference of the adjacent cell by writing the data "11" (threshold voltage distribution E) in the adjacent memory cell MC. That is, the correction write operation is executed on the memory cells MC that exist in lower skirts of the threshold voltage distributions Ax, Bx, and Cx. The application voltage of the non-selected word line WL connected to the adjacent memory cell MC is adjusted such that the verification voltage is increased by the voltage α, at the time of the correction write operation. As a result, as illustrated in FIG. 10, the distribution widths of the threshold voltage distributions A, B, and C after the correction write operation become narrower than the distribution widths of the threshold voltage distributions Ax, Bx, and Cx by α. As such, erroneous read can be decreased by the threshold voltage distributions A, B, and C where the distribution widths are narrowed.

During the write operation described above, the widths of the threshold voltage distributions A, B, and C can be narrowed. As a result, there is no need to read the threshold voltage of the memory cell connected to the word line WLn+1 adjacent to the selected word line WLn and correct data, at the time of the read operation. As a result, a read operation can be executed at a high speed. In particular, this embodiment is effective to a device where the number of times of rewriting data is small and the number of times of reading data is large.

During the determination operation of step S23, it is determined whether the data written in the memory cells MC connected to the word line WLn+1 is "11" (lowest threshold voltage distribution E). That is, the memory cells MC that are connected to the word line WLn+1 can be determined by one read operation. As a result, the correction write operation can be executed at a high speed.

Second Embodiment

Next, a non-volatile semiconductor storage device according to a second embodiment will be described with reference to FIGS. 11A and 11B. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

In the first embodiment, the correction write operation is executed after the data write operation on the memory cells MC connected to the adjacent word line WLn+1 ends. Meanwhile, in this embodiment, the correction write operation is executed in the background when the data write operation on the memory cells MC connected to all of the word lines WL ends and the memory cell array 1 is not accessed. This is the difference between the first embodiment and the second embodiment. Hereinafter, the second embodiment will be described with reference to FIG. 11A.

Figure 11A:
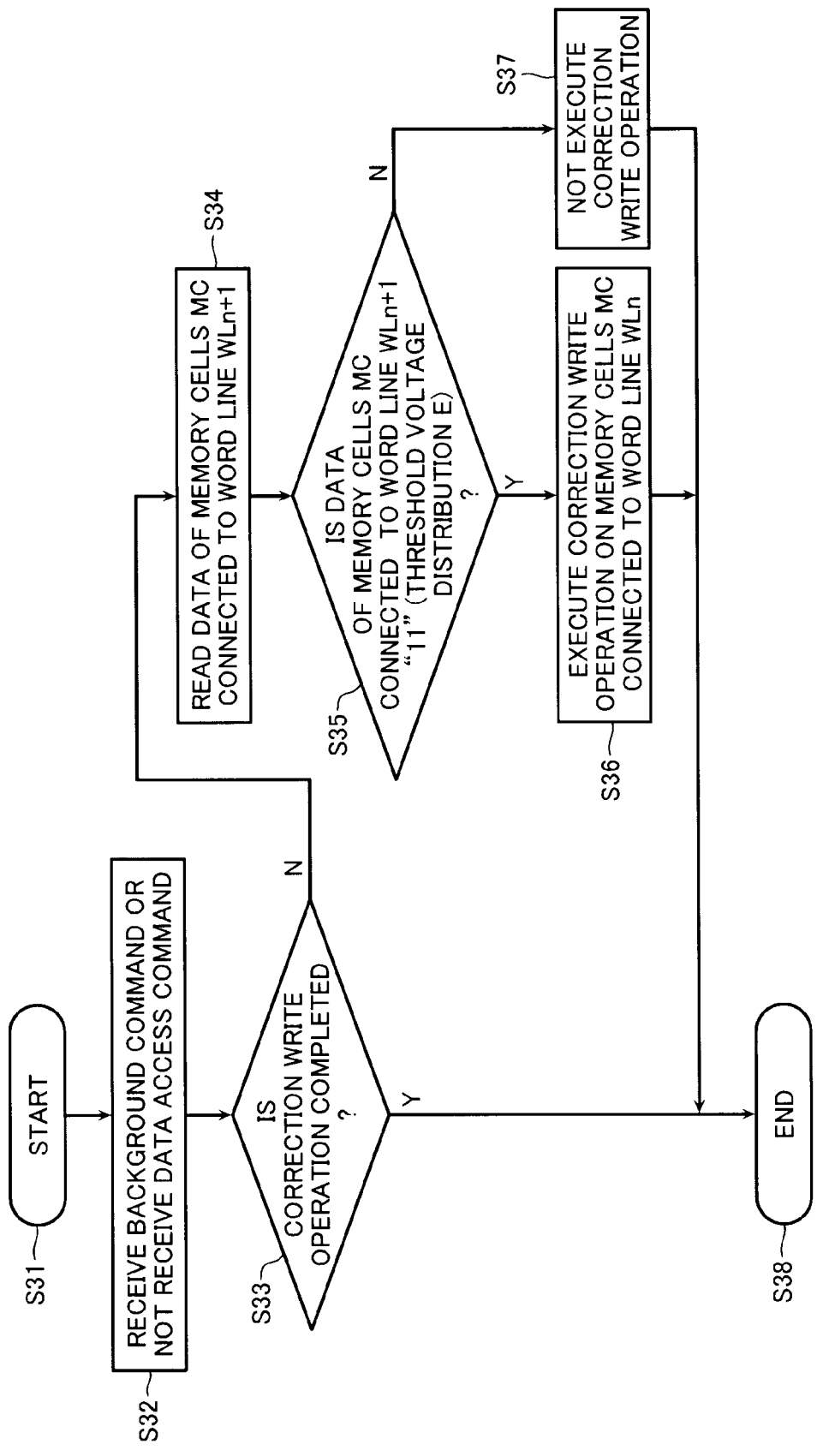
FIG. 11A is a flowchart illustrating a data write sequence according to a second embodiment.

FIG. 11A is a flowchart illustrating an operation added after the write operation on the memory cells MC connected to all of the word lines WL ends. After the data is written in the memory cells MC in the memory cell array 1, the correction write operation starts (step S31). Next, it is determined whether the control circuit 7 receives a background command or determined whether the control circuit 7 does not receive a data access command (step S32). When it is determined that the memory cell array 1 is not accessed and another operation is not executed on the basis of the commands (Y in step S32), it is determined whether the correction write operation is already executed on the memory cells MC (step S33). This determination operation can be executed on the basis of data of a circuit that is provided in the control circuit 7 and stores whether the correction write operation is executed on the memory cells MC. When the correction write operation is not executed on the memory cells MC, the correction write operation is executed.

The data that is written in the memory cells MC connected to the word line WLn+1 is read (step S34). Next, it is determined whether the data written in the memory cells MC connected to the word line WLn+1 is "11" (threshold voltage distribution E) or the other data ("01", "10", and "00" (threshold voltage distributions A, B, and C)) (step S35). During the determination operation of step S35, when it is determined that the data written in the memory cells MC connected to the word line WLn+1 is "11", the correction write operation is executed on the memory cells MC connected to the word line WLn (step S36). Meanwhile, when it is determined that the data written in the memory cells MC connected to the word line WLn+1 is not "11", the correction write operation is not executed (step S37). Then, the correction write operation on the memory cells MC connected to the word line WLn ends (step S38).

Figure 11B:
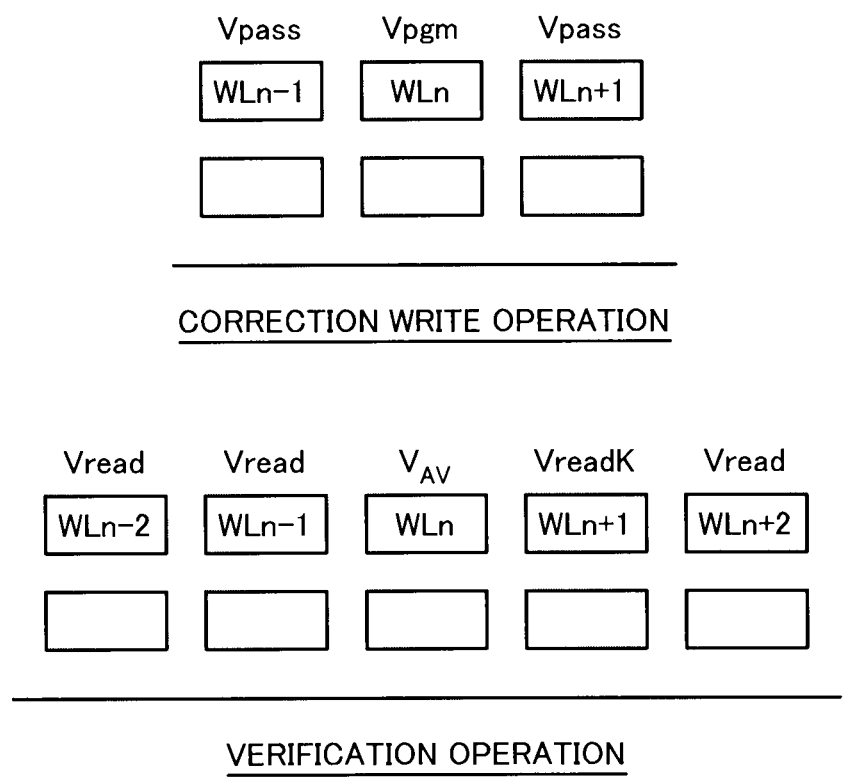
FIG. 11B is a diagram illustrating voltages at the time of a write operation and a verification operation according to the second embodiment.

FIG. 11B illustrates a voltage application state when the correction write operation is executed on the memory cells MC connected to the selected word line WLn. The application voltage at the time of the correction write operation according to this embodiment is the same as that of the first embodiment. In the second embodiment, during the verification operation at the time of the correction write operation, the verification voltage VAV does not change and a voltage VreadK (VreadK>Vread) is applied to the non-selected word line WLn+1 adjacent to the selected word line WLn.

Effect

Even in this embodiment, the correction write operation is executed on the memory cells MC rarely affected by the interference of the adjacent cell by writing the data "11" (threshold voltage distribution E) in the adjacent memory cell MC. The application voltage of the non-selected word line WL connected to the adjacent memory cell MC is adjusted such that the verification voltage is increased by the voltage α, at the time of the correction write operation. As a result, as illustrated in FIG. 10, the distribution widths of the threshold voltage distributions A, B, and C after the correction write operation become narrower than the distribution widths of the threshold voltage distributions Ax, Bx, and Cx by α. As such, erroneous read can be decreased by the threshold voltage distributions A, B, and C where the distribution widths are narrowed.

During the correction write operation according to the first embodiment, since the data write operation and the correction write operation are continuously executed, write time may increase. Meanwhile, the correction write operation according to this embodiment is executed during a period in which the memory cell array 1 is not accessed. For this reason, the correction write operation can be executed as a background job that is not recognized by a user, and the time needed to write the data does not increase. Even when the memory cell array 1 is being operated, barring affection to the operation speed, the correction write operation may be set to be executed.

Third Embodiment

Next, a non-volatile semiconductor storage device according to a third embodiment will be described with reference to FIGS. 12A and 12B. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

In the first embodiment, the correction write operation is executed when the data written in the memory cells MC connected to the adjacent word line WL is "11" (threshold voltage distribution E). Meanwhile, in this embodiment, the correction write operation is executed when the data written in the memory cells MC connected to the adjacent word line WL are "11" and "10" (threshold voltage distributions E and B). This is the difference between the first embodiment and the third embodiment. Hereinafter, the third embodiment will be described with reference to FIG. 12A.

Figure 12A:
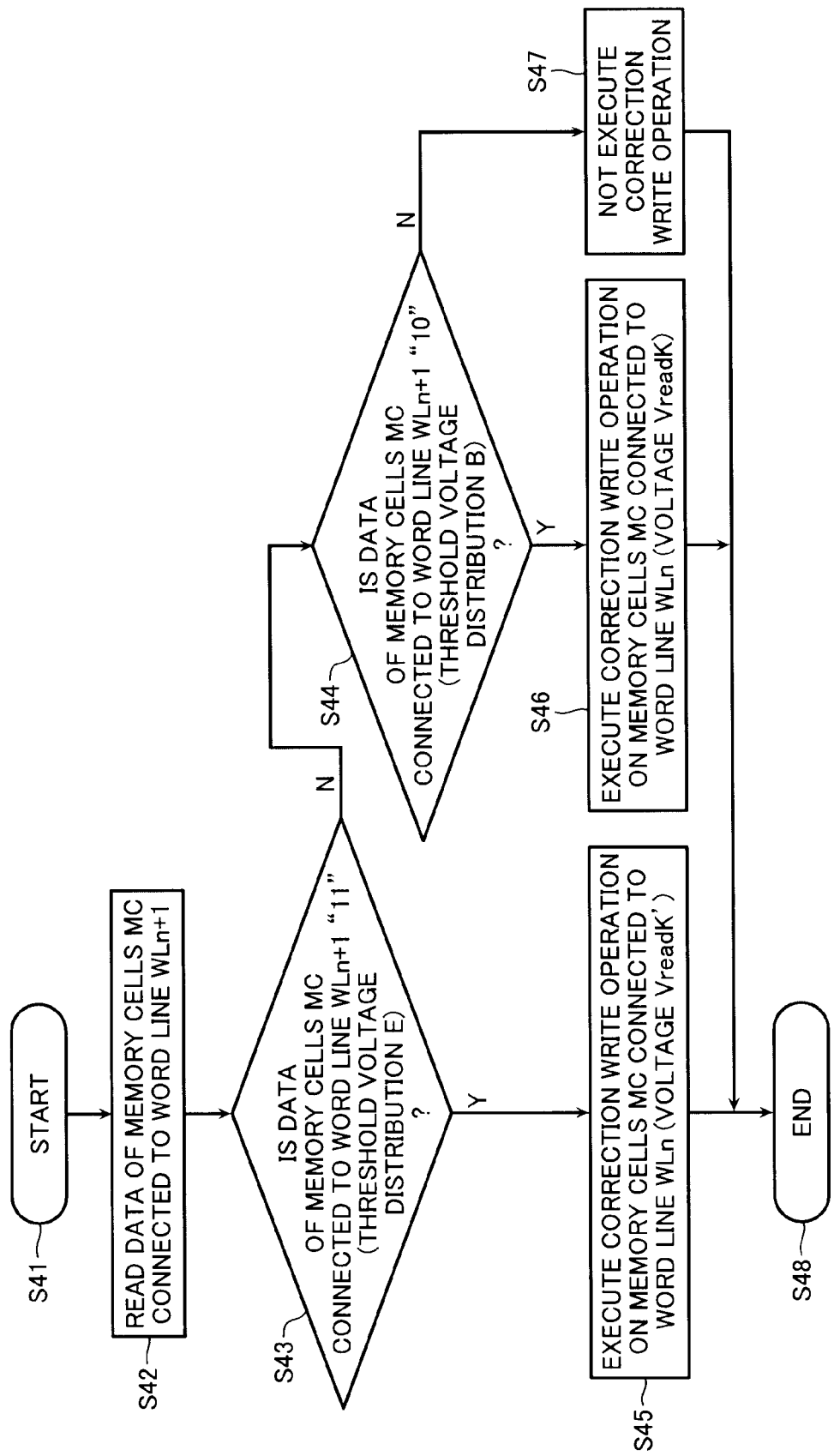
FIG. 12A is a flowchart illustrating a data write sequence according to a third embodiment.

FIG. 12A is a flowchart illustrating an operation added after the write operation on the memory cells MC connected to the word lines WLn and WLn+1 ends. After the data is written in the memory cells MC in the memory cell array 1, the correction write operation starts (step S41). Next, the data that is written in the memory cells MC connected to the word line WLn+1 is read (step S42). Next, it is determined whether the data written in the memory cells MC connected to the word line WLn+1 is "11" (threshold voltage distribution E) or the other data ("01", "10", and "00" (threshold voltage distributions A, B, and C)) (step S43). Further, it is determined whether the data written in the memory cells MC connected to the word line WLn+1 is "10" (threshold voltage distribution B) or the other data ("01" and "00" (threshold voltage distributions A and C)) (step S44).

During the determination operation of steps S43 and S44, when it is determined that the data written in the memory cells MC connected to the word line WLn+1 is "11" or "10", the correction write operation is executed on the memory cells MC connected to the word line WLn (steps S45 and S46). Meanwhile, when it is determined that the data written in the memory cells MC connected to the word line WLn+1 is not "11" or "10", the correction write operation is not executed (step S47). Then, the correction write operation on the memory cells MC that are connected to the word line WLn ends (step S48).

Figure 12B:
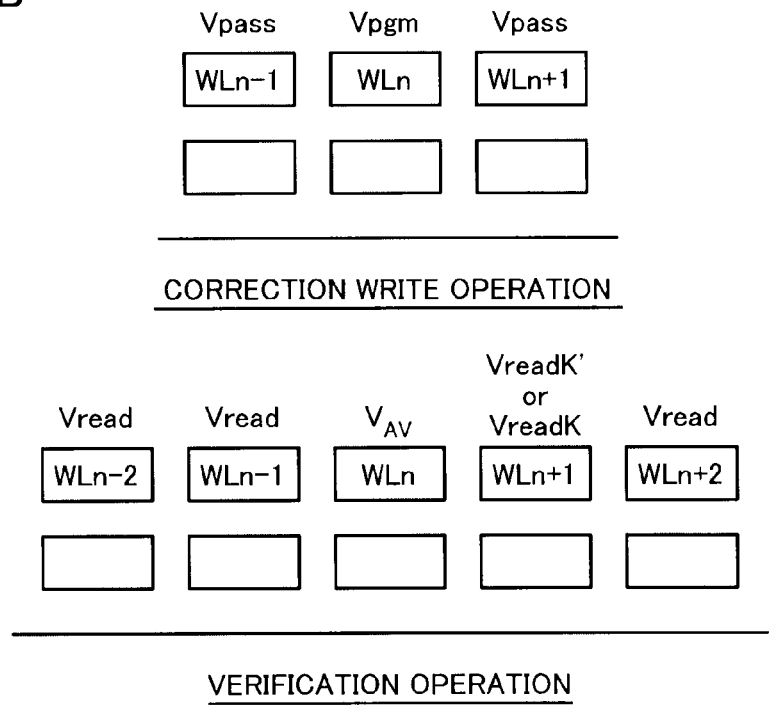
FIG. 12B is a diagram illustrating voltages at the time of a write operation and a verification operation according to the third embodiment.

FIG. 12B illustrates a voltage application state when the correction write operation is executed on the memory cells MC connected to the selected word line WLn. The verification operation that is executed with the correction write operation according to this embodiment is different from the verification operation according to the first embodiment in that the voltage applied to the non-selected word line WLn+1 adjacent to the selected word line WLn is set to VreadK' or VreadK (VreadK'>VreadK>Vread). In this case, when the data written in the memory cells MC connected to the word line WLn+1 is "11", the voltage applied to the non-selected word line WLn+1 is set to VreadK'. When the data written in the memory cells MC connected to the word line WLn+1 is "10", the voltage applied to the non-selected word line WLn+1 is set to VreadK.

Effect

As described above, upper skirts of the threshold voltage distributions A, B, and C of the memory cells MC after the upper page write operation are enlarged by the data write operation on the adjacent memory cell MC. The threshold voltage distributions A, B, and C become the threshold voltage distributions Ax, Bx, and Cx that have the larger distribution widths (refer to FIG. 7C). In this case, the magnitude of influence of the interference of the adjacent memory cell MC is changed by the magnitude of the voltage applied when data is written in the adjacent memory cell MC. When the data "01" or "00" are written at the time of the upper page write operation on the adjacent memory cell MC, the high write voltage is needed to move the threshold voltage from the threshold voltage distribution E or B' (refer to FIG. 5). When the data "10" is written at the time of the upper page write operation on the adjacent memory cell MC, the slightly high write voltage is needed to move the threshold voltage from the threshold voltage distribution B' (refer to FIG. 5). When the data "11" is held at the time of the upper page write operation on the adjacent memory cell MC, because the threshold voltage does not need to be moved from the threshold voltage distribution E, the write voltage is not needed (refer to FIG. 5). That is, the magnitude of influence of the interference when the data "10" (threshold voltage distribution B) is written in the adjacent memory cell MC is weaker than that when the data "01" and "00" (threshold voltage distributions A and C) are written.

In this embodiment, the correction write operation is executed on the memory cell MC that is rarely affected or slightly affected by the interference of the adjacent cell by writing the data "11" and "10" (threshold voltage distributions E and B) in the adjacent memory cell MC. At the time of the correction write operation, the voltage that is applied to the non-selected word line WLn+1 adjacent to the selected word line WLn is set to VreadK' or VreadK. In this case, the threshold voltage of the selected memory cell MC is decreased by the influence of the voltage VreadK' or VreadK applied to the adjacent word line WL. When the data "11" is written in the adjacent memory cell MC, the threshold voltage of the selected memory cell MC greatly decreases, and when the data "10" is written, the threshold voltage of the selected memory cell MC slightly decreases. Thereby, the verification operation becomes the same situation as that of the case where the verification voltage VAV+α' is applied to the selected word line WL when the data "11" is written in the adjacent memory cell MC and the verification voltage VAV+α (α'>α) is applied to the selected word line WL when the data "10" is written in the adjacent memory cell MC. In this embodiment, the correction write operation is executed on the basis of the verification voltage.

According to the correction write operation, the verification voltage at the time of the correction write operation can be adjusted on the basis of the magnitude of the influence of the interference of the adjacent memory cell MC, that is, the shift amount of the threshold voltage. According to the correction write operation in this embodiment, as illustrated in FIG. 10, the distribution widths of the threshold voltage distributions A, B, and C after the correction write operation can be further narrowed and erroneous read can be further decreased, in addition to the effect of the first embodiment.

Fourth Embodiment

Figure 13:
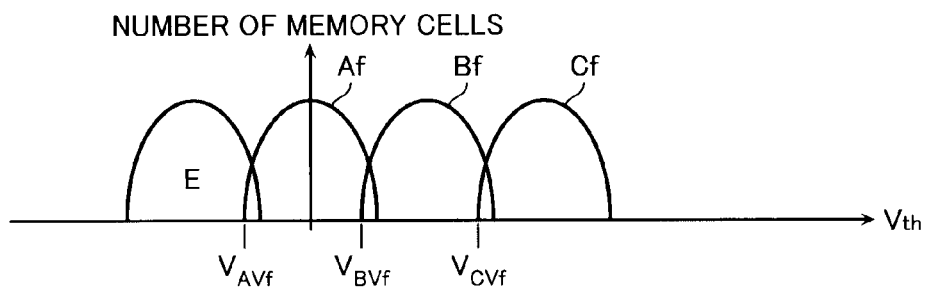
FIG. 13 is a conceptual diagram illustrating a data write sequence in a non-volatile semiconductor storage device according to a fourth embodiment.

Next, a non-volatile semiconductor storage device according to a fourth embodiment will be described with reference to FIGS. 13, 14 and 15. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

Write System According to the Fourth Embodiment

This embodiment is different from the embodiments described above in that a write system for executing write processing of two steps of foggy write processing to be rough write processing on upper page data/lower page data and fine write processing to be accurate write processing on the upper page data/lower page data is adopted.

The write operation according to the four-valued storage system that is executed with the foggy write processing and the fine write processing will be described with reference to FIGS. 13 and 14. First, as illustrated in FIG. 13, from a state where data of all of the memory cells MC is erased (threshold voltage distribution E), the foggy write processing is executed on the certain memory cell MC. The foggy write processing is write processing for referring to the verification voltages VAVf, VBVf, and VCVf each less than lower limit values of the threshold voltage distributions E, A, B, and C to be finally obtained and obtaining the threshold voltage distributions, Af, Bf, and Cf. The threshold voltage distributions after the foggy write processing become the threshold voltage distributions Af, Bf, and Cf to be overlapped to each other.

Figure 14:
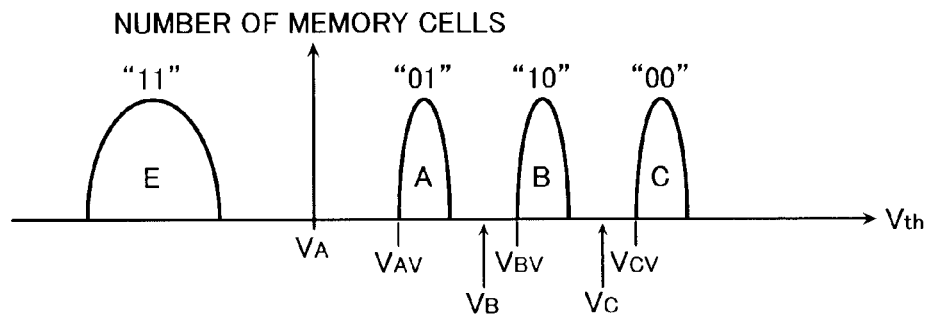
FIG. 14 is a conceptual diagram illustrating a data write sequence in the non-volatile semiconductor storage device according to the fourth embodiment.
Figure 15:
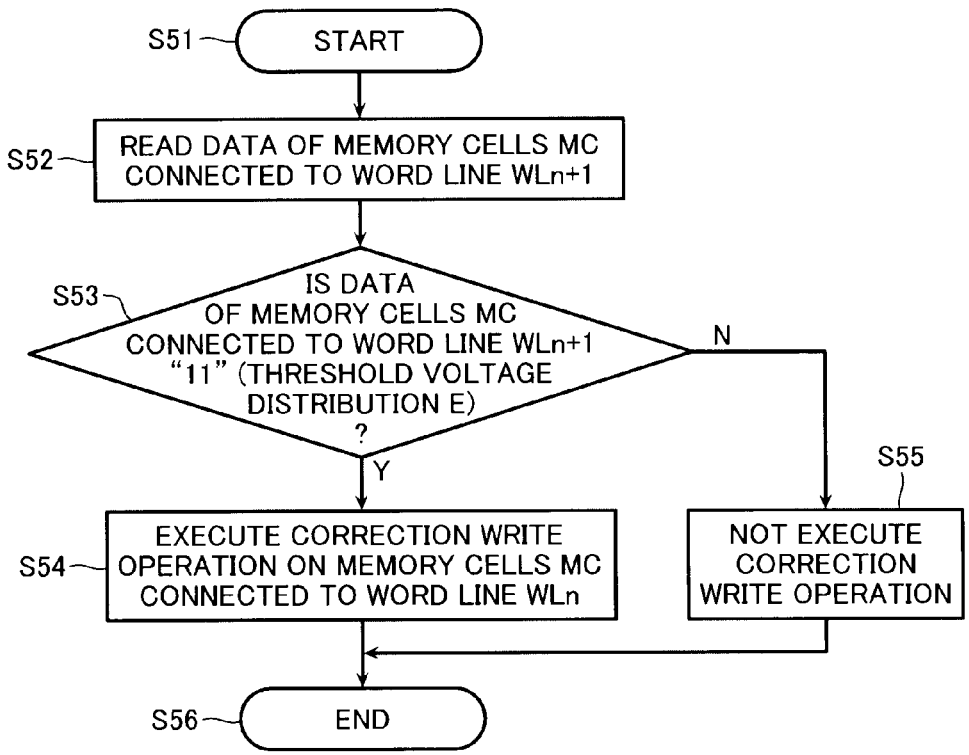
FIG. 15 is a flowchart illustrating a data write sequence according to the fourth embodiment.

Then, as illustrated in FIG. 14, the fine write processing is executed on the memory cell MC. The fine write processing is write processing for referring to the verification voltages VAV, VBV, and VCV equal to the lower limit values of the threshold voltage distributions A, B, and C to be finally obtained, moving the threshold voltage distributions Af, Bf, and Cf in a positive direction, and obtaining the threshold voltage distributions E, A, B, and C.

After the fine write processing, the threshold voltage distributions E, A, B, and C are changed by the interference of the adjacent cell, similar to the embodiments described above. Meanwhile, in this embodiment, after the fine write processing, the correction write operation for adjusting the widths of the threshold voltage distributions is executed. In this embodiment, with execution of the correction write operation, the voltage of the write verification operation for verifying whether the data is accurately written is adjusted. The voltage at the time of the write verification operation that is executed with the correction write operation is set on the basis of the data written in the memory cell MC adjacent to the selected memory cell MC to which the correction write operation is executed. As the correction write operation in this embodiment, the same operation as that of the first embodiment that is described using FIGS. 8 to 9B may be adopted.

The write operation, the correction write operation, and the write verification operation will be described with reference to FIG. 15. FIG. 15 is a flowchart illustrating an operation added after the write operation on the memory cells MC connected to the word lines WLn and WLn+1 ends. The data write operation is executed on the memory cells MC connected to the word line WLn and then the data write operation is executed on the memory cells MC connected to the word line WLn+1. When the data write operation on the memory cells MC connected to the word line WLn+1 ends, the correction write operation on the memory cells MC connected to the word line WLn starts (step S51).

During the correction write operation, first, data written in the memory cells MC connected to the word line WLn+1 is read (step S52). Next, it is determined whether the data written in the memory cells MC connected to the word line WLn+1 is "11" (threshold voltage distribution E) or the other data ("01", "10", and "00" (threshold voltage distributions A, B, and C)) (step S53). During the determination operation of step S53, when it is determined that the data written in the memory cells MC connected to the word line WLn+1 is "11", the correction write operation is executed on the memory cells MC connected to the word line WLn (step S54). Meanwhile, when it is determined that the data written in the memory cells MC connected to the word line WLn+1 is not "11", the correction write operation is not executed (step S55). Then, the correction write operation on the memory cells MC connected to the word line WLn end (step S56).

Effect

Even in this embodiment, the correction write operation is executed on the memory cells MC rarely affected by the interference of the adjacent cell by writing the data "11" (threshold voltage distribution E) in the adjacent memory cell MC. The application voltage of the non-selected word line WL connected to the adjacent memory cell MC is adjusted such that the verification voltage is increased by the voltage α, at the time of the correction write operation. As a result, as illustrated in FIG. 10, the distribution widths of the threshold voltage distributions A, B, and C after the correction write operation become narrower than the distribution widths of the threshold voltage distributions Ax, Bx, and Cx by α. As such, erroneous read can be decreased by the threshold voltage distributions A, B, and C where the distribution widths are narrowed. Further, a read operation can be executed at a high speed. As the correction write operation in this embodiment, the same operation as that of the second embodiment that is described using FIGS. 11A and 11B may be adopted.

Fifth Embodiment

Figure 16:
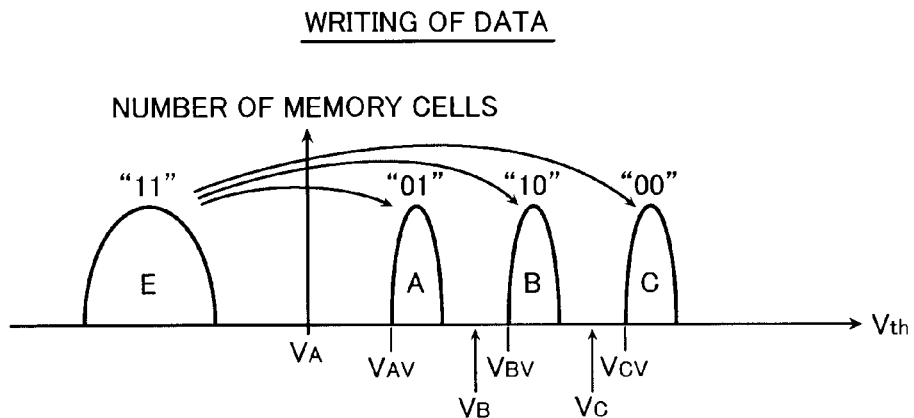
FIG. 16 is a conceptual diagram illustrating a data write sequence in a non-volatile semiconductor storage device according to a fifth embodiment.
Figure 17:
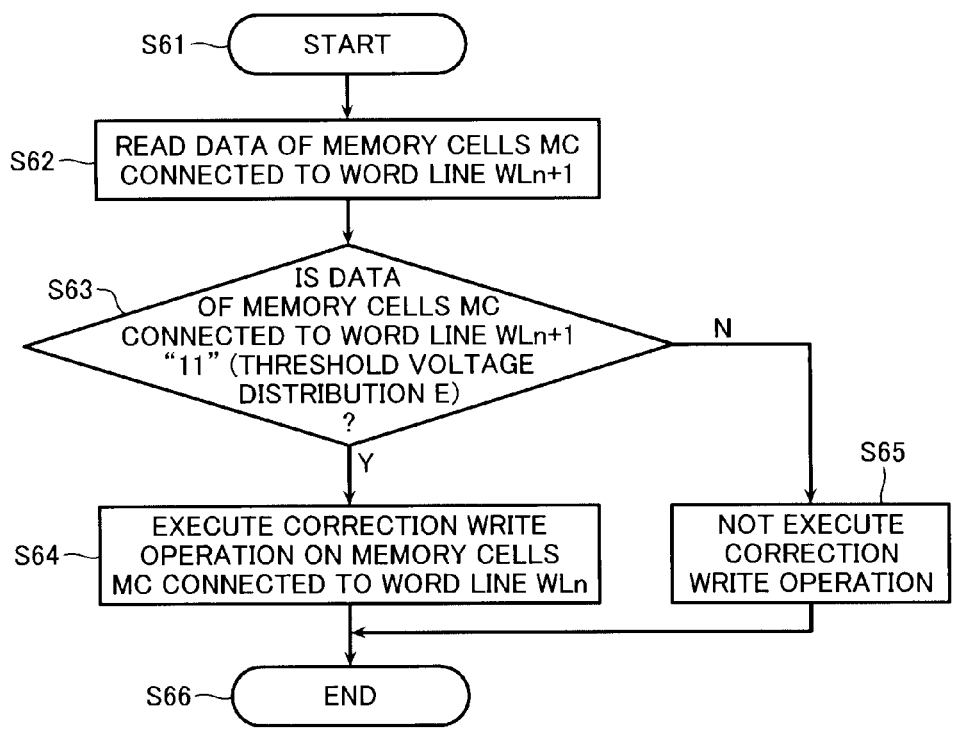
FIG. 17 is a flowchart illustrating a data write sequence according to the fifth embodiment.

Next, a non-volatile semiconductor storage device according to a fifth embodiment will be described with reference to FIGS. 16 and 17. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

Write System According to the Fifth Embodiment

This embodiment is different from the embodiments described above in that a write system for executing the accurate write processing on the upper page data/lower page data by one write processing is adopted, without executing the stepwise write processing on the upper page data/lower page data.

The write operation in the four-valued storage system based on one-time write processing will be described with reference to FIG. 16. As illustrated in FIG. 16, from a state in which data of all of the memory cells MC is erased (threshold voltage distribution E), the threshold voltage distributions E, A, B, and C are obtained by referring to the verification voltages VAV, VBV, and VCV equal to the lower limit values of the threshold voltage distributions A, B, and C to be finally obtained and moving the threshold voltage distributions in a positive direction.

After the write processing in this embodiment, the threshold voltage distributions E, A, B, and C are changed by the interference of the adjacent cell, similar to the embodiments described above. Meanwhile, in this embodiment, after the write processing, the correction write operation for adjusting the widths of the threshold voltage distributions is executed. In this embodiment, with execution of the correction write operation, the voltage of the write verification operation for verifying whether the data is accurately written is adjusted. The voltage at the time of the write verification operation that is executed with the correction write operation is set on the basis of the data written in the memory cell MC adjacent to the selected memory cell MC to which the correction write operation is executed. As the correction write operation in this embodiment, the same operation as that of the first embodiment that is described using FIGS. 8 to 9B may be adopted.

The write operation, the correction write operation, and the write verification operation will be described with reference to FIG. 17. FIG. 17 is a flowchart illustrating an operation added after the write operation on the memory cells MC connected to the word lines WLn and WLn+1 ends. The data write operation is executed on the memory cells MC connected to the word line WLn and then the data write operation is executed on the memory cells MC connected to the word line WLn+1. When the data write operation on the memory cells MC connected to the word line WLn+1 ends, the correction write operation on the memory cells MC connected to the word line WLn starts (step S61).

During the correction write operation, first, data written in the memory cells MC connected to the word line WLn+1 is read (step S62). Next, it is determined whether the data written in the memory cells MC connected to the word line WLn+1 is "11" (threshold voltage distribution E) or the other data ("01", "10", and "00" (threshold voltage distributions A, B, and C)) (step S63). During the determination operation of step S63, when it is determined that the data written in the memory cells MC connected to the word line WLn+1 is "11", the correction write operation is executed on the memory cells MC connected to the word line WLn (step S64). Meanwhile, when it is determined that the data written in the memory cells MC connected to the word line WLn+1 is not "11", the correction write operation is not executed (step S65). Then, the correction write operation on the memory cells MC connected to the word line WLn ends (step S66).

Effect

Even in this embodiment, the correction write operation is executed on the memory cells MC rarely affected by the interference of the adjacent cell by writing the data "11" (threshold voltage distribution E) in the adjacent memory cell MC. The application voltage of the non-selected word line WL connected to the adjacent memory cell MC is adjusted such that the verification voltage is increased by the voltage α, at the time of the correction write operation. As a result, as illustrated in FIG. 10, the distribution widths of the threshold voltage distributions A, B, and C after the correction write operation become narrower than the distribution widths of the threshold voltage distributions Ax, Bx, and Cx by α. As such, erroneous read can be decreased by the threshold voltage distributions A, B, and C where the distribution widths are narrowed. Further, a read operation can be executed at a high speed. As the correction write operation in this embodiment, the same operation as that of the second embodiment that is described using FIGS. 11A and 11B may be adopted.

Sixth Embodiment

Next, a non-volatile semiconductor storage device according to a sixth embodiment will be described with reference to FIGS. 18A and 18B. The entire configuration of the non-volatile semiconductor storage device according to this embodiment is the same as that of the first embodiment and the overlapped description is omitted. The components similar to those of the first embodiment are denoted by the same reference numerals and the overlapped description is omitted. In this embodiment, the write system for executing the accurate write processing on the upper page data/lower page data by one-time write processing that is described in the fifth embodiment is adopted.

In the fifth embodiment, the correction write operation is executed when the data written in the memory cells MC connected to the adjacent word line WL is "11" (threshold voltage distribution E). Meanwhile, in this embodiment, the correction write operation is executed when the data written in the memory cells MC connected to the adjacent word line WL are "11", "01", and "10" (threshold voltage distributions E, A, and B). This is the difference between the fifth embodiment and the sixth embodiment. The sixth embodiment will be described with reference to FIG. 18A.

FIG. 18A is a flowchart illustrating an operation added after the write operation on the memory cells MC connected to the word lines WLn and WLn+1 ends. First, the data write operation is executed on the memory cells MC connected to the word line WLn and then the data write operation is executed on the memory cells MC connected to the word line WLn+1. When the data write operation on the memory cells MC connected to the word line WLn+1 ends, the correction write operation on the memory cells MC connected to the word line WLn starts (step S70). Next, the data that is written in the memory cells MC connected to the word line WLn+1 is read (step S71). Next, it is determined whether the data written in the memory cells MC connected to the word line WLn+1 is "11" (threshold voltage distribution E) or the other data ("01", "10", and "00" (threshold voltage distributions A, B, and C)) (step S72). It is determined whether the data written in the memory cells MC connected to the word line WLn+1 is "01" (threshold voltage distribution A) or the other data ("10" and "00" (threshold voltage distributions B and C)) (step S73). In addition, it is determined whether the data written in the memory cells MC connected to the word line WLn+1 is "10" (threshold voltage distribution B) or the other data ("00" (threshold voltage distribution C)) (step S74).

During the determination operation of steps S72, S73, and S74, when it is determined that the data written in the memory cells MC connected to the word line WLn+1 is "11", "01", or "10", the correction write operation is executed on the memory cells MC connected to the word line WLn (steps S75, S76, and S77). Meanwhile, when it is determined that the data written in the memory cells MC connected to the word line WLn+1 is "00", the correction write operation is not executed (step S78). Then, the correction write operation on the memory cells MC that are connected to the word line WLn ends (step S79).

Figure 18B:
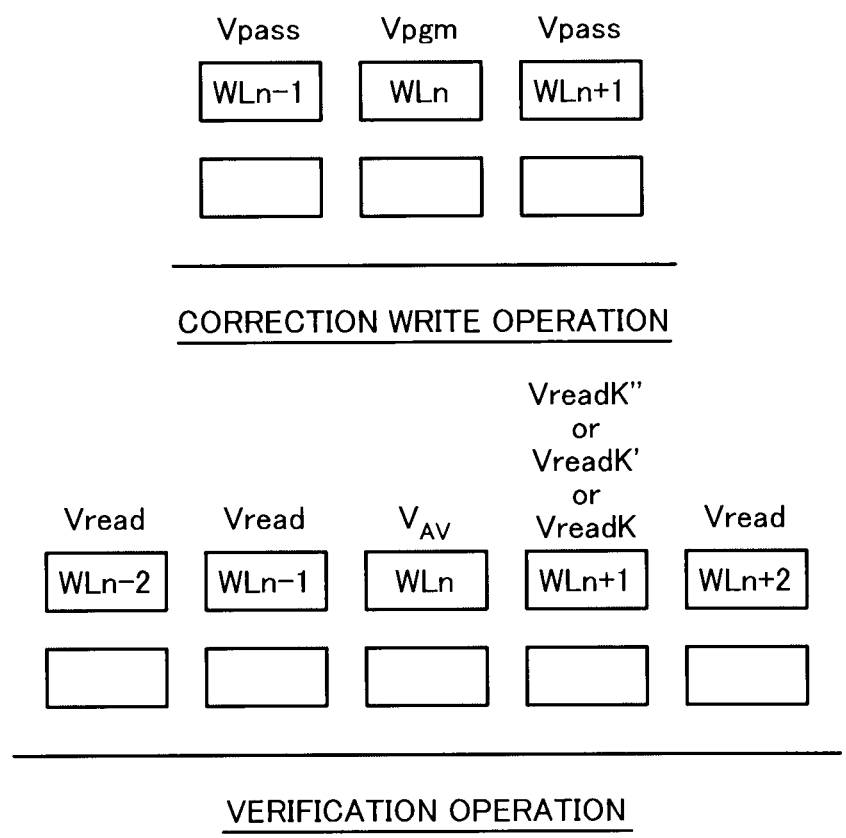
FIG. 18B is a diagram illustrating voltages at the time of a write operation and a verification operation according to the sixth embodiment.

FIG. 18B illustrates a voltage application state when the correction write operation is executed on the memory cells MC connected to the selected word line WLn. During the verification operation that is executed with the correction write operation according to this embodiment, the voltage that is applied to the non-selected word line WLn+1 adjacent to the selected word line WLn is set as VreadK", VreadK', or VreadK (VreadK">VreadK'>VreadK>Vread). In this case, when the data written in the memory cells MC connected to the word line WLn+1 is "11", the voltage applied to the non-selected word line WLn+1 is set to VreadK". When the data written in the memory cells MC connected to the word line WLn+1 is "01", the voltage applied to the non-selected word line WLn+1 is set to VreadK'. When the data written in the memory cells MC connected to the word line WLn+1 is "10", the voltage applied to the non-selected word line WLn+1 is set to VreadK.

Effect

Even in the write system for executing the accurate write processing on the upper page data/lower page data by one-time write processing, upper skirts of the threshold voltage distributions A, B, and C of the memory cells MC after the write operation are enlarged by the data write operation on the adjacent memory cell MC. The threshold voltage distributions A, B, and C become the threshold voltage distributions that have the larger distribution widths (refer to FIG. 7C). In this case, the magnitude of influence of the interference of the adjacent memory cell MC is changed by the magnitude of the voltage applied when data is written in the adjacent memory cell MC. When the data "00" is written at the time of the write operation on the adjacent memory cell MC, the high write voltage is needed to move the threshold voltage from the threshold voltage distribution E (refer to FIG. 16). When the data "10" is written at the time of the write operation on the adjacent memory cell MC, the write voltage that is lower than the voltage when the data "00" is written is needed. When the data "01" is written at the time of the write operation on the adjacent memory cell MC, the write voltage that is lower than the voltage when the data "10" is written is needed. When the data "11" is held in the adjacent memory cell MC, because there is no need to move the threshold voltage from the threshold voltage distribution E, the write voltage is not needed. That is, the magnitude of influence of the interference when the data is written in the adjacent memory cell MC follows a relation of the data "01"<"10"<"00". That is, the magnitude of influence of the interference with respect to the selected memory cell MC by the data write operation increases in order of the threshold voltage distributions A, B, and C.

In this embodiment, the correction write operation is executed on the memory cell MC where the data "11", "01", and "10" (threshold voltage distributions E, A, and B) are written in the adjacent memory cells MC. At the time of the correction write operation, the voltage that is applied to the non-selected word line WLn+1 adjacent to the selected word line WLn is set to VreadK", VreadK', or VreadK. In this case, the threshold voltage of the selected memory cell MC is decreased by the voltage VreadK", VreadK', or VreadK applied to the adjacent word line WL. When the data "11" is written in the adjacent memory cell MC, the threshold voltage of the selected memory cell MC is maximally decreased. When the data "01" is written in the adjacent memory cell MC, the decrease amount of the threshold voltage of the selected memory cell MC becomes smaller than that of when the data "11" is written. When the data "10" is written in the adjacent memory cell MC, the decrease amount of the threshold voltage of the selected memory cell MC becomes smaller than that of when the data "01" is written. Thereby, a state becomes the same state as that of the case where the verification operation where the verification voltage VAV+α" is applied to the selected word line WL when the data "11" is written in the adjacent memory cell MC, the verification voltage VAV+α' is applied to the selected word line WL when the data "01" is written in the adjacent memory cell MC, and the verification voltage VAV+α is applied to the selected word line WL when the data "10" is written in the adjacent memory cell MC (α">α'>α). In this embodiment, the correction write operation is executed on the basis of the verification voltage.

According to the correction write operation, the verification voltage at the time of the correction write operation can be adjusted on the basis of the magnitude of the influence of the interference of the adjacent memory cell MC, that is, the shift amount of the threshold voltage. According to the correction write operation in this embodiment, the distribution widths of the threshold voltage distributions A, B, and C after the correction write operation can be narrowed and erroneous read can be decreased. Further, a read operation can be executed at a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, in the embodiments described above, the non-volatile semiconductor storage device of the four-valued storage system (2 bits/cell) is used. However, the invention is not limited thereto and the invention may be applied to multi-bit storage systems such as an eight-valued storage system.

What is claimed is:

1. A non-volatile semiconductor storage device, comprising:
a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and
a control circuit configured to execute a write operation by applying a write voltage to the word line to set a threshold voltage of a selected memory cell corresponding to data, and a correction write operation accompanied by the write operation and executed on the selected memory cell, when a threshold voltage of data written in a reference memory cell is an erase level, the reference memory cell being the memory cell adjacent to the selected memory cell and in which the data is written after the write operation on the selected memory cell.

2. The non-volatile semiconductor storage device according to claim 1,
wherein the control circuit does not execute the correction write operation on the selected memory cell, when the threshold voltage of the reference memory cell is not the erase level, at the time of the correction write operation.

3. The non-volatile semiconductor storage device according to claim 1,
wherein the control circuit executes the correction write operation on the selected memory cell, even when the threshold voltage of the reference memory cell is not the erase level, at the time of the correction write operation, and
the control circuit determines magnitude of the correction write operation on the selected memory cell corresponding to the threshold voltage of the reference memory cell.

4. The non-volatile semiconductor storage device according to claim 1,
wherein the control circuit applies a read voltage higher than a voltage of a verification read operation at the time of the write operation, to a word line connected to a memory cell adjacent to the selected memory cell, when executing the verification read operation at the time of the correction write operation.

5. The non-volatile semiconductor storage device according to claim 1,
wherein the control circuit determines a value of a read voltage applied to a word line connected to a memory cell adjacent to the selected memory cell corresponding to the threshold voltage of the reference memory cell, when executing the verification read operation at the time of the correction write operation.

6. The non-volatile semiconductor storage device according to claim 5, wherein the control circuit sets the read voltage such that the lower the value of the threshold voltage of the reference memory cell is, the higher the read voltage becomes.

7. The non-volatile semiconductor storage device according to claim 1,
wherein the control circuit executes the correction write operation on the selected memory cell in a background when the memory cell array is not accessed after the write operation on the selected memory cell.

8. The non-volatile semiconductor storage device according to claim 1,
wherein the control circuit is configured to execute the write operation including an upper page write operation based on an upper page data and a lower page write operation based on a lower page data.

9. The non-volatile semiconductor storage device according to claim 1,
wherein the control circuit is configured to execute the write operation by two steps of write processing including foggy write processing and fine write processing, the foggy write processing writing a first threshold voltage lower than a threshold voltage corresponding to the data to be written, the fine write processing writing a second threshold voltage corresponding to the data to be written.

10. The non-volatile semiconductor storage device according to claim 1,
wherein the control circuit is configured to execute the write operation by one-time write processing.

11. A non-volatile semiconductor storage device, comprising:
a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and
a control circuit configured to execute a write operation by applying a write voltage to the word line to set a threshold voltage of a selected memory cell corresponding to data,
the control circuit being configured to control whether a correction write operation accompanied by the write operation is executed on the selected memory cell depending on data written in a reference memory cell, the reference memory cell being the memory cell adjacent to the selected memory cell and in which the data is written after the write operation on the selected memory cell.

12. The non-volatile semiconductor storage device according to claim 11,
wherein the control circuit applies a read voltage higher than a voltage of a verification read operation at the time of the write operation, to a word line connected to a memory cell adjacent to the selected memory cell, when executing the verification read operation at the time of the correction write operation.

13. The non-volatile semiconductor storage device according to claim 11,
wherein the control circuit determines a value of a read voltage applied to a word line connected to a memory cell adjacent to the selected memory cell corresponding to the threshold voltage of the reference memory cell, when executing the verification read operation at the time of the correction write operation.

14. The non-volatile semiconductor storage device according to claim 13,
wherein the control circuit sets the read voltage such that the lower the value of the threshold voltage of the reference memory cell is, the higher the read voltage becomes.

15. The non-volatile semiconductor storage device according to claim 11,
wherein the control circuit executes the correction write operation on the selected memory cell in a background when the memory cell array is not accessed after the write operation on the selected memory cell.

16. A non-volatile semiconductor storage device, comprising:
a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and
a control circuit configured to execute a write operation by applying a write voltage to the word line to set a threshold voltage of a selected memory cell corresponding to data,
the control circuit being configured to control a read voltage depending on data written in a reference memory cell, the read voltage being applied to a word line connected to a memory cell adjacent to the selected memory cell when the verification read operation is executed at the time of the correction write operation accompanied with the write operation, the reference memory cell being the memory cell adjacent to the selected memory cell and in which the data is written after the write operation on the selected memory cell.

17. The non-volatile semiconductor storage device according to claim 16,
wherein the control circuit applies a read voltage higher than a voltage of a verification read operation at the time of the write operation, to a word line connected to a memory cell adjacent to the selected memory cell, when the verification read operation is executed at the time of the correction write operation.

18. The non-volatile semiconductor storage device according to claim 16,
wherein the control circuit determines a value of a read voltage applied to a word line connected to a memory cell adjacent to the selected memory cell corresponding to the threshold voltage of the reference memory cell, when the verification read operation is executed at the time of the correction write operation.

19. The non-volatile semiconductor storage device according to claim 18,
wherein the control circuit sets the read voltage such that the lower the value of the threshold voltage of the reference memory cell is, the higher the read voltage becomes.

20. The non-volatile semiconductor storage device according to claim 16, wherein the control circuit executes the correction write operation on the selected memory cell in the background when the memory cell array is not accessed after the write operation on the selected memory cell.

* * * * *